Sept. 12, 1961 C. M. SMITH 2,999,895

SPACER FOR MOUNTING ELECTRICAL ELEMENTS ON SUPPORTS

Filed Nov. 9, 1959

INVENTOR.
CHARLES M. SMITH
BY Morris [signature]
ATTORNEY

United States Patent Office 2,999,895
Patented Sept. 12, 1961

2,999,895

SPACER FOR MOUNTING ELECTRICAL ELEMENTS ON SUPPORTS

Charles M. Smith, Haddonfield, N.J., assignor to Radio Corporation of America, a corporation of Delaware Filed Nov. 9, 1959, Ser. No. 851,822
2 Claims. (Cl. 174—138)

This invention relates to spacers, and more particularly to a spacer useful in electronic apparatus for maintaining a transistor or the like in spaced relation to a mounting therefor, such as a chassis, printed circuit board, or the like.

In electronic apparatus, various electronic devices such as capacitors, resistors, tubes, transistors, and the like may be employed. Many of these devices have bases which rest on mounting surfaces, such as chassis, printed circuit boards, etc. to which their terminal leads are connected, or, in some cases, the devices rest on washers placed between the devices and the mounting surfaces. It has been found that when the base of such a device rests on a printed circuit board or washer, for example, moisture accumulates between the base of the device and the board or washer which can impair the efficiency of the device. Once the devices are positioned, as on a printed circuit board, their terminal leads, in most instances, are soldered to a printed circuit board in order to insure a proper connection. It has been found that, in soldering the terminal leads to a printed circuit board, heat is generated which may be injurious to these devices and also that a soldering flux may remain after the soldering process is completed which may impair the efficiency of these devices.

It is therefore a primary object of this invention to provide an improved spacer for use between various electronic devices, such as transistors and the mounting surfaces therefor which will be free from the aforementioned difficulties.

It is still another object of this invention to provide an improved spacer for electronic devices, which spacer is capable of allowing air to circulate between the base of an electronic device and a mounting board to which the terminal leads of such device are attached.

It is still another object of this invention to provide an improved spacer as aforesaid capable of elevating an electronic device above a mounting board to which it is attached such that the heat generated during the soldering of the terminal leads to the mounting board will not damage the electronic device.

It is still another object of this invention to provide an improved spacer as above set forth which is adapted to allow the removal of any soldering flux remaining after the soldering of the terminal leads of an electronic device to a mounting board therefor.

It is still a further object of this invention to provide a spacer as set forth above which is capable of being used with an electronic device containing any configuration of terminal leads and which is self-centering.

It is still a further object of the invention to provide a spacer of the type set forth which is capable of supporting electronic devices having variously shaped bottoms.

It is still a further object of this invention to provide an improved spacer as aforesaid which has great strength, is simple and economical to manufacture, and is highly efficient in use.

According to this invention, a spacer of heat and electrical insulating material is molded or cast to form a disk having a central opening somewhat in the form of a four-pointed star. Both sides of the disk are formed with a plurality of opposed, circumferentially spaced, radial protrusions, such as ribs, for example, the ribs on one side of the disk being preferably aligned with the ribs on the opposite side. The spacer is placed between the base of a transistor, for example, and a mounting board such as a printed circuit board so that the ribs on one side of the disk support the transistor base and the ribs on the opposite side rest on the printed circuit board. The two sets of ribs maintain the disk midway between the transistor base and the printed circuit board. The transistor leads extend through the opening in the disk and are connected to the printed circuit board. The configuration of the opening is such that it can readily receive and accommodate the transistor terminal leads in many known arrangements.

The novel features of the invention, as well as additional objects and advantages thereof, will be understood more fully from the following description when read in connection with the accompanying drawings, in which.

Figure 1:
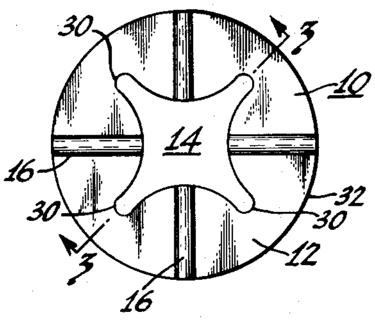
FIG. 1 is a plan view of one form of spacer according to the present invention.
Figure 2:
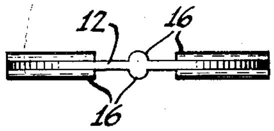
FIG. 2 is an elevational view of the spacer of FIG. 1.

Referring now more particularly to FIGS. 1 and 2 of the drawing, a spacer 10 is shown including a base in the form of a disk 12 having a somewhat star-shaped opening 14 of four sides and a plurality of protrusions, such as the ribs 16 thereon. The spacer 10 is molded or cast from insulating material, such as "nylon," or the like, with the base or disk 12 preferably in the form of a wafer. The size of the opening 14, and the diameter of the disk are such as to accommodate transistors having bases of various sizes and shapes. One such transistor 22 having a base 24 and three terminal leads 26 is shown, by way of illustration, in FIG. 3. The thickness of the disk 12 and the ribs 16 can be such as to provide any desired separation between the transistor 22 and a printed circuit board 28 on which the transistor is mounted. The leads 26 of the transistor extend through the star-shaped opening 14. The four identical corners 30 of the star-shaped opening 14 are rounded to such a degree as to accommodate certain of the terminal leads 26 of the transistor 22 as illustrated in FIGS. 4 through 7, the star-shaped opening 14 being adapted to receive, among others, any of the configurations of leads shown in FIGS. 4 through 7. The opening 14 may be circular, if desired, but is shaped preferably to have a greater transverse dimension in one direction than in another in order to readily accommodate various arrangements of terminal leads without sacrificing strength of the spacer, and also to provide self-centering of the transistor base on the spacer. An opening of somewhat star-shape is well suited for these purposes. The ribs 16 on each face of the disk are preferably formed integral with the disk 12 and may be formed in the same mold or cast at the same time and of the same material as the disk 12. Each surface of the disk 12 is formed with two pairs of opposed ribs 16 which extend radially along a common diameter, the ribs 16 extending substantially from the center opening 14, midway between two adjacent pairs of corners 30 of the four-pointed star, to substantially the periphery 32 of the disk 12. The radial ribs 16 are thus distributed circumferentially about the opening 14, the ribs 16 on one side of the disk 12 being disposed in alignment with the ribs 16 on the opposite side of the disk 12.

Figure 3:
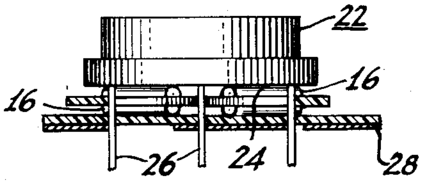
FIG. 3 is a cross-sectional view taken along line 3—3 of FIG. 1 and showing a three-terminal type transistor mounted thereon.
Figures 4, 5, 7:
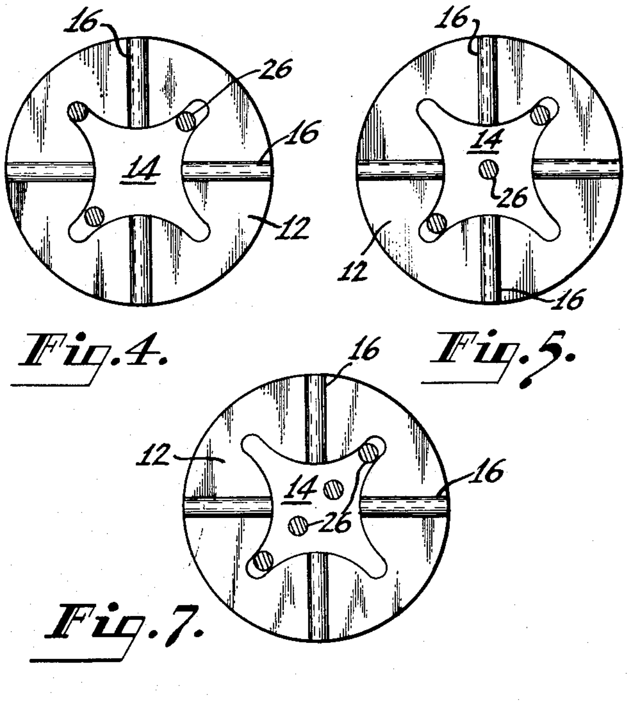
FIGS. 4 to 7 are illustrations of four different arrangements of terminal lead configurations projected on plan views of the spacer illustrated in FIG. 1.
Figure 6:
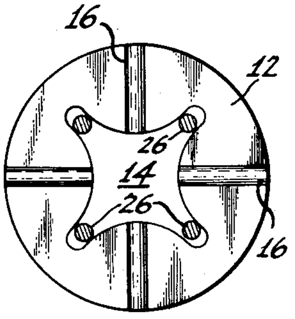

In operation, the spacer, as illustrated in FIG. 3, is placed between the base 24 of the transistor 22 and the printed circuit board 28. In the case of a three-terminal transistor 22 wherein the terminal leads 26 are arranged in triangular relation, as illustrated in FIGS. 3 and 4, the transistor leads 26 of such a three-terminal transistor 22 extend through the opening 14 with its leads 26 arranged in three of the corners 30 of the four-pointed star opening. This automatically centers the spacer 10 under the base 24 of the transistor 22. When the spacer 10 is placed between the printed circuit board 28 and the transistor base 24, the ribs 16 on one side of the disk 12 will engage the printed circuit board 28, and the transistor base 24 will engage and rest on the ribs 16 on the other side of the disk 12 to be supported thereon above the printed circuit board 28. With the spacer 10 between the transistor 22 and the printed circuit board 28, when the terminal leads 26 are soldered to the printed circuit board 28, the heat from the soldering process dissipates through the space between the ribs. The disk 12 protects the base 24 of the transistor from the heat generated during the soldering process. Any soldering flux remaining in the area of the soldered leads can be removed through the open spaces between the ribs 16. During the operation of the transistor 22, the ribs 16 on each side of the disk 12 separate the transistor from the printed circuit board by a distance sufficient to allow air to circulate between the transistor base 24 and the printed circuit board, thereby keeping the area free from any accumulation of moisture. FIGS. 5 through 7 are plan views of the spacer 10 with various other arrangements of terminal leads 26 of transistors shown in cross-section. FIG. 5 shows the terminal leads 26 of a three-terminal lead transistor in a straight line arrangement with two of the leads positioned at diagonally opposite corners 30 of the four-pointed star opening 14, and the intermediate lead 26 at about the center of the opening 14. In this arrangement, the three leads 26 are disposed in a straight line along the greatest transverse dimension (i.e., a diagonal) of the opening 14. This permits making the opening with its four sides curved inwardly toward the center thereof so as to make the ribs 16 of maximum length thereby giving the spacer maximum strength. FIG. 6 illustrates an arrangement of the terminal leads 26 of a four-terminal lead transistor with each of the terminal leads 26 positioned in one of the corners 30 of the opening 14. FIG. 7 is still another arrangement of the terminal leads of a four-terminal lead transistor with the terminal leads 26 positioned in a straight line extending between diagonally opposite corners 30 of the four-pointed star opening 14 similarly to the arrangement of FIG. 5.

From the foregoing description, it will be apparent that I have provided an improved spacer which will increase the efficiency of transistors and other electronic components which are required to be spaced from their supporting surfaces or mountings. While I have illustrated and described one particular form of spacer, it will, no doubt, be apparent to those skilled in the art, that various changes may be made in this particular form, and that other forms are possible, all within the spirit of the present invention. For example, depending upon the particular form or nature of the electronic or electrical component to be supported thereon, the disk 12 may be other than a circular wafer, as shown, and the opening 14 may be other than star-shaped. Also, instead of forming the protrusions 16 as continuous ribs, they may be formed as two or more discrete protuberances spaced from each other along radial or any other suitable paths extending from the periphery of the disk 12 to the opening 14. Other changes will, no doubt, readily suggest themselves to those skilled in the art. Hence, I desire that the foregoing shall be taken merely as illustrative and not in a limiting sense.

What is claimed is:

1. A spacer comprising a disk of insulating material, said disk being formed with a central, four-pointed, substantially symmetrical, star-shaped opening, said opening being defined by four arcuate-shaped sides, center points of opposite pairs of said arcuate-shaped sides being closer to each other than the respective ends of said opposite pairs of sides, and four radially disposed ribs extending outwardly from said disk and symmetrically spaced on said disk, each of said ribs extending between a separate one of said center points of said sides and the periphery of said disk.

2. A spacer comprising a disk of insulating material, said disk being formed with a central, four-pointed, substantially symmetrical, star-shaped opening, said opening being defined by four arcuate-shaped sides, center points of opposite pairs of said arcuate-shaped sides being closer to each other than the respective ends of said opposite pairs of sides, and four radially disposed ribs symmetrically spaced on said disk, each of said ribs protruding from each of the surfaces of said disk, and each of said ribs extending between a separate one of said center points of said sides and the periphery of said disk.

References Cited in the file of this patent

UNITED STATES PATENTS

| | | |
|---|---|---|
| 1,105,267 | Goetz | July 28, 1914 |
| 2,024,547 | Strongson | Dec. 17, 1935 |
| 2,192,760 | Thorson | Mar. 5, 1940 |
| 2,214,151 | Wagar | Sept. 10, 1940 |
| 2,863,131 | Carlzen et al. | Dec. 2, 1958 |

FOREIGN PATENTS

| | | |
|---|---|---|
| 1,070,297 | France | Feb. 17, 1954 |